(12) United States Patent
Joshi

(10) Patent No.: US 6,798,688 B2
(45) Date of Patent: Sep. 28, 2004

(54) STORAGE ARRAY SUCH AS A SRAM WITH REDUCED POWER REQUIREMENTS

(75) Inventor: Rajiv V. Joshi, Yorktown Heights, NY (US)

(73) Assignee: International Business Machines Corp., Armonk, NY (US)

(*) Notice: Subject to any disclaimer, the term of this patent is extended or adjusted under 35 U.S.C. 154(b) by 0 days.

(21) Appl. No.: 10/306,938

(22) Filed: Nov. 29, 2002

(65) Prior Publication Data

US 2004/0105299 A1 Jun. 3, 2004

(51) Int. Cl.$^7$ .............................. G11C 11/00
(52) U.S. Cl. ................................... 365/154
(58) Field of Search ....................... 365/154, 226, 365/189.04, 230.08, 230.06, 189.01, 189.07, 189.09

(56) References Cited

U.S. PATENT DOCUMENTS 6,057,188 A * 5/2000 El-Kareh et al. ........... 438/243
6,326,809 B1 * 12/2001 Gambles et al. ............ 365/154
6,683,805 B2    1/2004 Joshi et al.
2003/0189849 A1 * 10/2003 Khellah et al. ............. 365/200

* cited by examiner

Primary Examiner—Thong Le
(74) Attorney, Agent, or Firm—Law Office of Charles W. Peterson, Jr.; Louis J. Percello

(57) ABSTRACT

A CMOS storage array such as a static random access memory (SRAM) and a sense amplifier. The SRAM may be in partially depleted (PD) silicon on insulator (SOI) and may include fully depleted (FD) FETs. A power line supply select at each row selectively increases cell supply voltage to a full supply voltage when the row is selected. A word line decoder selects a row of cells that are provided the supply voltage and cells in remaining rows are provided a reduced supply voltage. Leakage is substantially lower in said remaining rows than in said selected row. The sense amplifier may include cross coupled FD NFETs sensing stored data. A read/write-select in each bit path selectively blocks cell writes when cell contents are not being changed. Power is not expended unnecessarily writing to cells.

51 Claims, 4 Drawing Sheets

STORAGE ARRAY SUCH AS A SRAM WITH REDUCED POWER REQUIREMENTS

CROSS REFERENCE TO RELATED APPLICATION

The present application is related to U.S. patent application Ser. No. 10/067,411, now issued as U.S. Pat. No. 6,683,805 B2 entitled "Suppression of Leakage Currents in VLSI Logic and Memory Circuits" to Joshi et al., published Aug. 7, 2003 as US 2003/0147272 A1, and assigned to the assignee of the present invention.

BACKGROUND OF THE INVENTION

1. Field of the Invention

The present invention is related to storage arrays, especially static random access memories (SRAMs) and more particularly to reducing SRAM power consumption.

2. Background Description

Semiconductor technology and chip manufacturing advances have resulted in a steady increase of on-chip clock frequencies, the number of transistors on a single chip and the die size itself coupled with a corresponding decrease in chip supply voltage. Generally, all other factors being constant, the power consumed by a given clocked unit increases linearly with the frequency of switching within it. Thus, not withstanding the decrease of chip supply voltage, chip power consumption has increased as well. Both at the chip and system levels, cooling and packaging costs have escalated as a natural result of this increase in chip power. For low end systems (e.g., handhelds, portable and mobile systems), where battery life is crucial, net power consumption reduction is important but, without degrading performance below acceptable levels.

To minimize power consumption, most integrated circuits (ICs) used in such low end systems (and elsewhere) are made in the well-known complementary insulated gate field effect transistor (FET) technology known as CMOS. A typical CMOS circuit includes paired complementary devices, i.e., an n-type FET (NFET) paired with a corresponding p-type FET (PFET), usually gated by the same signal. Since the pair of devices have operating characteristics that are, essentially, opposite each other, when one device (e.g., the NFET) is on and conducting (ideally modeled as a closed switch), the other device (the PFET) is off, not conducting (ideally modeled as an open switch) and, vice versa.

For example, a CMOS inverter is a series connected PFET and NFET pair that are connected between a power supply voltage ($V_{dd}$) and ground (GND). Both are gated by the same input and both drive the same output, the PFET pulling the output high and the NFET pulling the output low at opposite input signal states. Ideally, when the gate of a NFET is below some positive threshold voltage ($V_T$) with respect to its source, the NFET is off, i.e., the switch is open. Above $V_T$, the NFET is on conducting current, i.e., the switch is closed. Similarly, a PFET is off when its gate is above its $V_T$, i.e., less negative, and on below $V_T$. Thus, ideally, the CMOS inverter in particular and CMOS circuits in general pass no static (DC) current. So, ideal CMOS circuits use no static or DC power and only consume transient power from charging and discharging capacitive loads.

In practice however, transient power for circuit loads accounts for only a portion of the power consumed by CMOS circuits. A typical FET is much more complex than a switch. FET drain to source current (and so, power consumed) is dependent upon circuit conditions and device voltages. FETs are known to conduct what is known as subthreshold current below threshold for NFETs and above for PFETs. Subthreshold current increases with the magnitude of the device's drain to source voltage ($V_{ds}$) and inversely with the magnitude of the device $V_T$. Also, there is some portion of any input transition (rise or fall), when both devices are conducting, i.e., the portion of the input transition between the turn on point of one device (e.g., above the NFET $V_T$) and the turn off point of the other, i.e., below $V_{dd}$ by more than $V_T$ for the PFET. The current flowing during this period of orthogonality when both devices are on is also known as flush current and, the power consumed is known as short circuit power. So, in addition to transient power, all CMOS circuits consume some short circuit power and some power from subthreshold currents.

For logic chips such as general and special purpose processors, non-load related power dissipation is fairly randomly distributed throughout the logic. Transient power tends to dominate logic chip power consumption. Storage arrays, however, such as random access memories (RAMs) and especially static RAMs (SRAMs), have a large areas that may remain dormant during any one operation. Thus, in these dormant areas, subthreshold leakage can become a substantial source of power consumption. Furthermore, even in portions of RAMs that are active during a typical operation, i.e., an access, and especially SRAMs, large portions of the active area are unnecessarily active.

A typical SRAM array may be organized n word lines by m bit lines (bit line pairs) by k bits. So, accessing one bit from one of the k (or more) subarrays entails selecting one of the n word lines. Of the m cells partially selected by that word line, only one (on one of the m bit lines) may actually be accessed. During a read, each of the bit line pairs rises/droops only to develop enough signal (e.g., 50 mV) for a sense amplifier. During a write, however, the pair for the cell being accessed may be driven at least what is termed "rail to rail," i.e., to opposite extremes ($V_{dd}$ and GND). Thus, each write also consumes significant transient power.

Since low end systems may include several chips, it is important to reduce power in each. However, typically, memory accounts for a large number of those chips. Especially with low end systems those memory chips are SRAM. So, SRAM chip power is multiplied by the number of SRAM chips included. While high chip power may be tolerable for a single (e.g., processor) chip, when multiplied by a number SRAM chips it can account for a significant portion of system power, making the difference between acceptable and unacceptable system battery life.

Thus, there is a need for reduced chip power consumption and especially for chips containing arrays such as SRAMs.

SUMMARY OF THE INVENTION

It is a purpose of the invention to reduce storage array power consumption;

It is another purpose of the invention to reduce SRAM power consumption;

It is yet another purpose of the invention to reduce SRAM power consumption without impacting performance;

It is yet another purpose of the invention to reduce subthreshold leakage in SRAM arrays.

The present invention relates to a CMOS storage array such as a static random access memory (SRAM) and a sense amplifier. The SRAM may be in partially depleted (PD)

silicon on insulator (SOI) and may include fully depleted (FD) FETs. A power supply select line at each row selectively increases cell supply voltage to a full supply voltage when the row is selected. A word line decoder selects a row of cells that are provided the supply voltage and cells in remaining rows are provided a reduced supply voltage. Leakage is substantially lower in said remaining rows than in said selected row. The sense amplifier may include cross coupled FD NFETs sensing stored data. A read/write-select in each bit path selectively blocks cell writes when cell contents are not being changed. Power is not expended unnecessarily writing to cells.

BRIEF DESCRIPTION OF THE DRAWINGS

The foregoing and other objects, aspects and advantages will be better understood from the following detailed preferred embodiment description with reference to the drawings, in which.

DESCRIPTION OF THE PREFERRED EMBODIMENTS

The present invention relates to a storage array such as a register file or static random access memory (SRAM) in the well-known complementary insulated gate FET technology known as CMOS. Power consumption is reduced by substantially reducing subthreshold leakage in unaccessed array areas and by only writing to locations where data is necessary being changed. Preferably, the array may be an array of six transistor (6T) latches or storage cells. More particularly, the storage array may be a CMOS SRAM is in what is known as partially depleted (PD) silicon on insulator (SOI) technology. While application of the present invention is advantageous to almost any technology or any SRAM, it is most advantageous in PD SOI CMOS SRAMs to reduce initial-cycle parasitic bipolar current, especially in the SRAM array. In addition to increasing power consumption, bipolar leakage current in non-selected cells in a common SRAM bit/column can degrade PD SOI SRAM read and write performance.

Thus, a preferred embodiment SRAM includes a new decode, both word and bit decode. Unselected word line cells are in a reduced subthreshold state and, the word line decode places cells at selected word lines in a high performance state, thereby reducing or eliminating subthreshold leakage in the unaccessed dormant array portions. The bit decode operates normally during a read. Upon a write request, however, the bit decode checks the state of each selected cell and only completes the write, if the cell state is being changed. So, what is to be written is compared with what is currently stored and a write to any cell occurs only if the cell contents and the data being written do not match, i.e., the cell contents are to be changed by the write. Otherwise, the bit decode blocks the write, avoiding the waste of power by an unnecessary bit write. Thus, the present invention saves both array power by reducing or eliminating subthreshold leakage in cells on unselected word lines and in particular, bipolar leakage current in those cells and by not wasting power on unnecessary bit writes.

Figure 1:
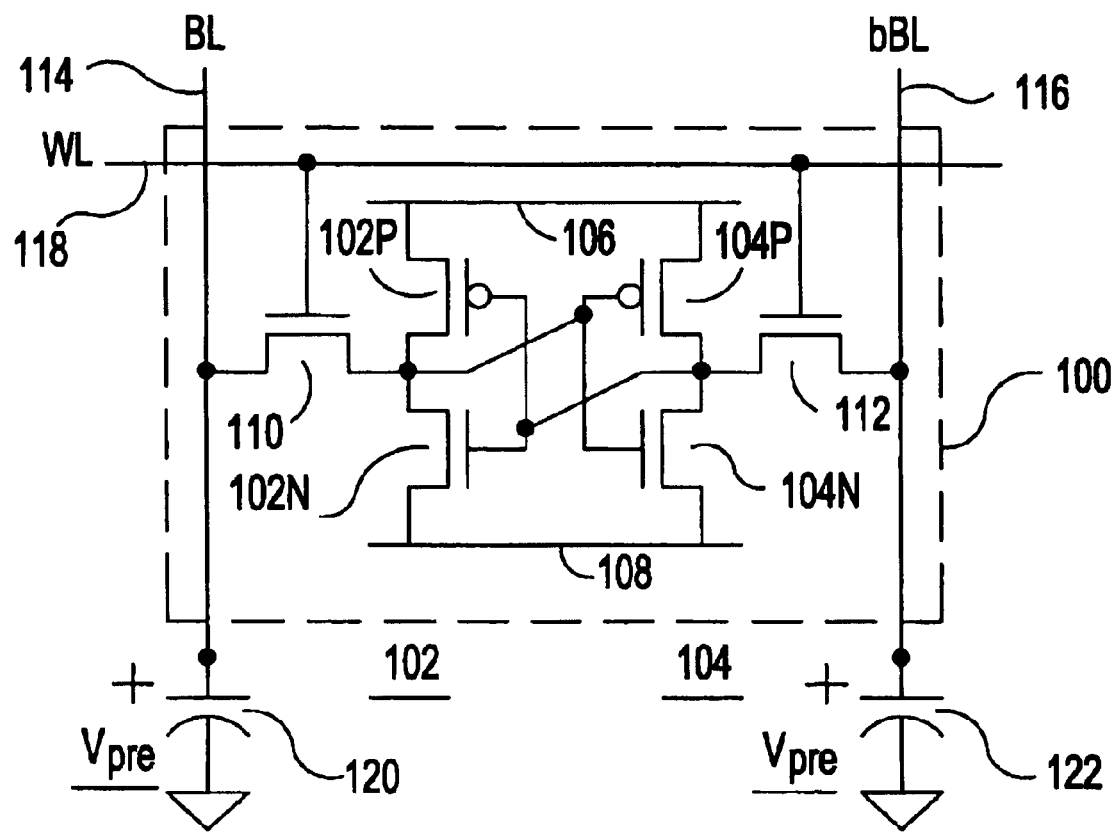
FIG. 1 shows an example of preferred embodiment six transistor (6T) PD SOI CMOS SRAM cells.

Accordingly, FIG. 1 shows an example of one preferred embodiment six transistor (6T) CMOS static random access memory (SRAM) cell 100 and more particularly in PD SOI CMOS. Data is stored in a pair of cross-coupled inverters 102, 104. The first inverter 102 includes NFET 102N and p-type FET (PFET) 102P series connected between power line 106 and array return or source line (e.g., ground) 108. The second inverter 104 includes NFET 104N and PFET 104P, which are also series connected between power line 106 and source line 108. A pair of pass gates 110, 112 are connected between each of the cross coupled inverters 102, 104 and a respective bit line pair 114, 116. A word line 118 connects the pass gates 110, 112 of numerous parallel SRAM cells 100 in a word or word line direction and partially selects the connected SRAM cells. Typically, a common bit line pair 114, 116 connects numerous identical parallel SRAM cells 100 in a bit line or column. Cells 100 in each column are each connected to a different word line to form an SRAM array or subarray. In this example, a pair of capacitors 120, 122 model the capacitive load of the bit line pair 114, 116. Each cell 100 is addressed/selected by intersection of both the power line 106 and the word line 118 at a bit line pair 114, 116.

Figure 2:
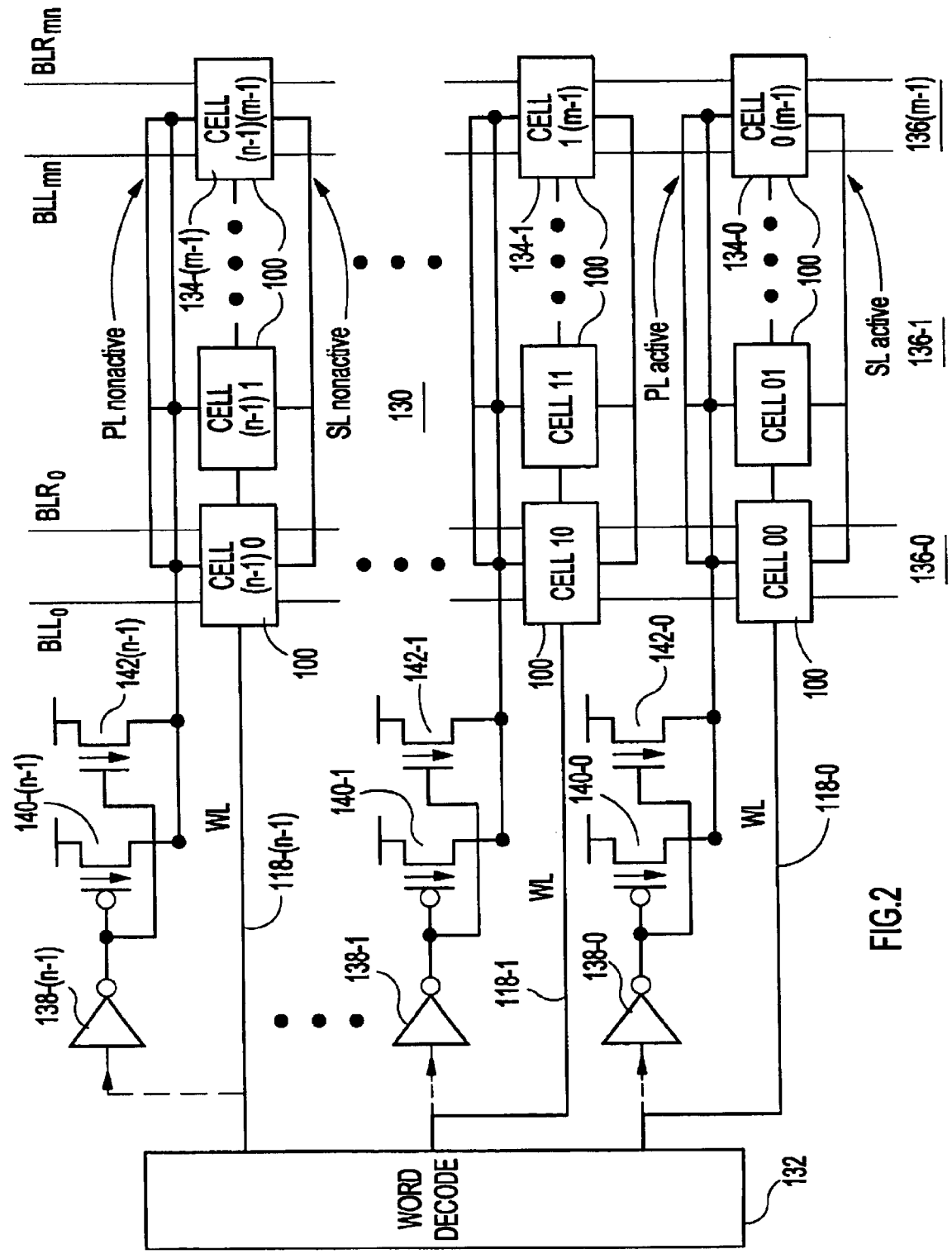
FIG. 2 shows an example of a cross-section of a preferred embodiment n by m SRAM array.

FIG. 2 shows an example of a cross-section of a preferred embodiment n by m SRAM array 130, wherein a word decoder 132 selects and drives one of n word lines 118-0, 118-1, ..., 118-(n−1). Each word line 118 partially selects one row 134-0, 134-1, ..., 134-(n−1) of m cells 100 on m columns 136-0, 136-1, ..., 136-(m−1). The word decoder 132 also (directly or indirectly, e.g., through buffer (not shown)) drives an inverter 138-0, 138-1, ..., 138-(n−1), which drives a complementary pair of power select FETs 140-0, 140-1, ..., 140-(n−1), and 142-0, 142-1, ..., 142-(n−1) at each of the n power lines 106-0, 106-1, ..., 106-(n−1). Each power select PFET 140-0, 140-1, ..., 140-(n−1), and NFET 142-0, 142-1, ..., 142-(n−1) of the complementary pair is connected at one source/drain terminal to $V_{dd}$ and selectively provides power to its respective power line 106-0, 106-1, ..., 106-(n−1). In an optional embodiment, NFETs 142-0, 142-1, ..., 142-(n−1) are ungated, tied gate to drain in a FET diode configuration.

As with any typical SRAM array, during standby, when a preferred SRAM 130 is not being accessed, word decoder 132 holds all of the word lines low. Thus, all n word lines 118-0, 118-1, ..., 118-(n−1) and the input to inverter 138-0, 138-1, ..., 138-(n−1) are low. So, the gates of PFETs 140-0, 140-1, ..., 140-(n−1) and NFETs 142-0, 142-1, ..., 142-(n−1) are high. So, the PFETs 140-0, 140-1, ..., 140-(n−1) are off and, the NFETs 142-0, 142-1, ..., 142-(n−1) are on, supplying a voltage below $V_{dd}$ by the NFET threshold, i.e., $V_{dd}-V_T$. Because the voltage across any cell device (102N,P or 104N,P) in any cell 100 is reduced below $V_{dd}$ by $V_T$, bipolar and subthreshold leakage is dramatically reduced in those unselected cells.

A cell 100 is selected by selecting one of the word lines, e.g., 118-1 driving the selected word line 118-1 and the input to a corresponding inverter 138-1 high. In every cell 100 on the selected word line 118-1, pass gates 110, 112 are turned on, connecting the cross-coupled inverters 102, 104 to bit line pairs 114, 116 in each of the m columns 136-0, 136-1, ..., 136-(m−1). Additionally, however, the output of the selected inverter 138-1 is low turning on the corresponding PFET 140-1 and off the corresponding NFET 142-1. Thus, the selected PFET 140-1 pulls the connected power lines 106-1 to full $V_{dd}$. As long as the selected word line 118-1 is high (i.e., during a read and/or write) a full $V_{dd}$ is provided to the selected row 134-1 with $V_{dd}$-$V_T$ at the remaining rows 134-0, . . . , 134-(n-1) in a reduced leakage state.

During standby, i.e., between accesses, all of the bit lines (i.e., 114, 116 in every column 136-0, 136-1, . . . , 136-(m-1)) are pre-charged to some bit line pre-charge voltage level ($V_{pre}$), typically $V_{dd}$. Initially, to SRAM locations, the pre-charged bit lines are floated and a selected word line (e.g., 118-1) is driven high. Simultaneously, the power line 106-1 for the selected row 134-1 is pulled from $V_{dd}$-$V_T$ to $V_{dd}$ by the corresponding PFET, 140-1 in this example. Whatever is stored in the cells 100 of the corresponding row (as represented by the respective complementary states of a cross coupled inverters 102, 104 of FIG. 1), is transferred to a corresponding bit line pair 114, 116. However, that data transfer is effected by only a small voltage difference on the pair with one of the pair being pulled below the pre-charge voltage to a minimum sense amp signal level. How fast the bit line is pulled to the minimum sense amp signal level depends upon, amongst other things, cell supply voltage and determines cell read time or read performance. Thus, by selectively driving the selected row to $V_{dd}$ read performance is not affected.

By contrast data is written into cells 100 by driving one of the selected bit line pair low and holding the other high for a short period of time prior to dropping the selected word line 118-1. With the word line 118-1 high, the state of the selected bit line pair 114, 116 is transferred to cross coupled inverters 102, 104. With the word line 118-1 low, that state is stored in the cells 100. In prior art SRAMs data was written to selected cells 100, regardless of the contents of the SRAM cell prior to the write. Thus, if the contents were unchanged by the write, (50—50 odds), the power used to recharge the discharged bit line was wasted. Accordingly, the present invention avoids wasting this power for further SRAM power savings.

Figure 3:
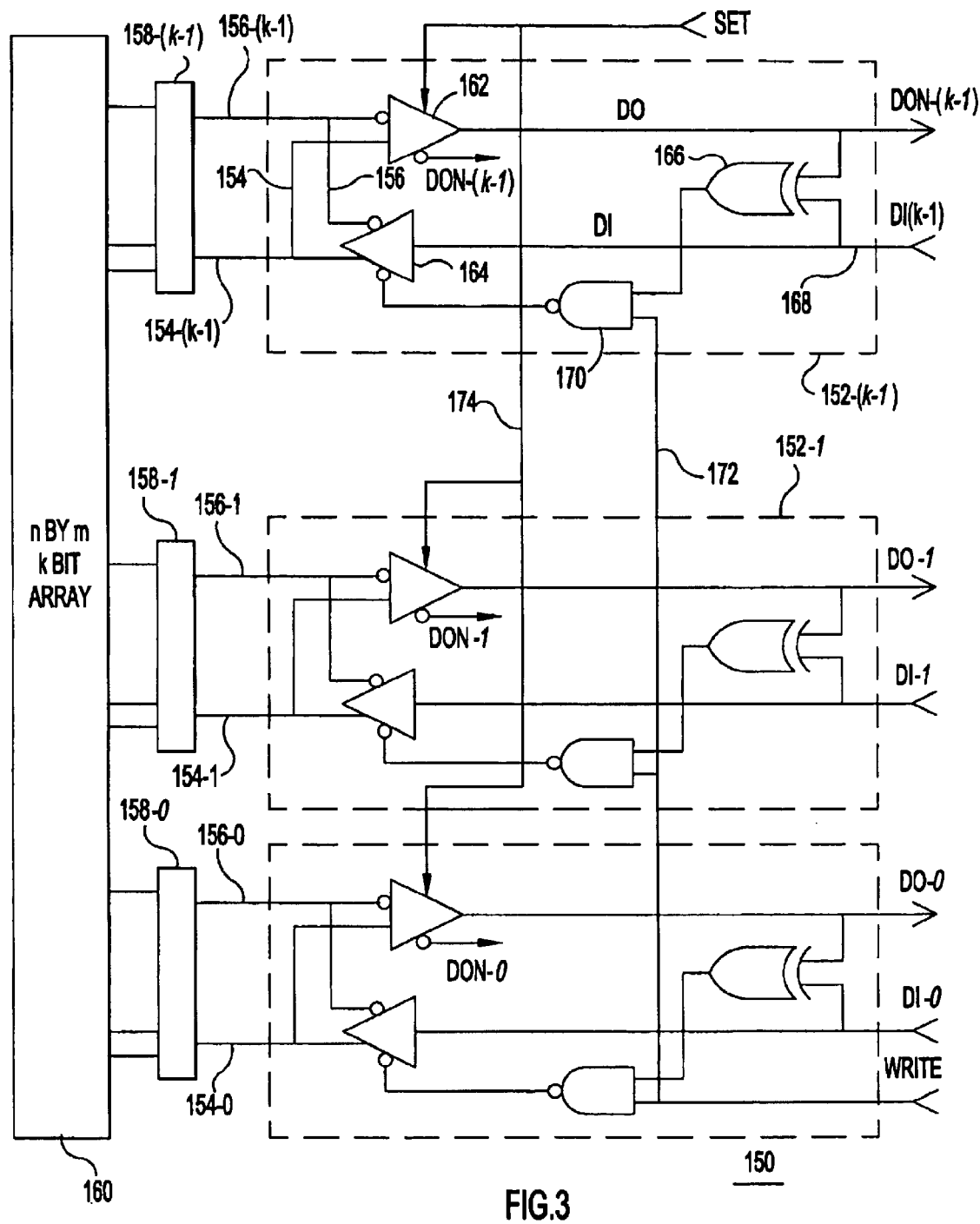
FIG. 3 shows an example of a kbit n by m SRAM with a preferred embodiment low power read/write-select.

FIG. 3 shows an example of a kbit n by m SRAM 150 with a preferred embodiment low power read/write-select 152-0, 152-1, . . . , 152-(k-1) in the data path for each bit. Each low power read/write-select 152-0, 152-1, . . . , 152-(k-1) is connected to a complementary data line pair 154-0, 156-0, 154-1, 156-1, 154-(k-1), 156-(k-1) transferring data to/from a column select logic or bit decoders 158-0, 158-1, . . . , 158-(k-1), which selectively couples a bit line pair (e.g., 114, 116 in FIG. 2) from one column (e.g., 136-0, 136-1, . . . , 136-(m-1) for in FIG. 2) in array 160 to the complementary data lines 154-0, 156-0, 154-1, 156-1, 154-(k-1), 156-(k-1). Array 160 is a typical kbit n by m SRAM array, which may be a kbit wide n by m SRAM array 130 of FIG. 2. Low power read/write-select 152-0, 152-1, . . . , 152-(k-1) each includes a sense amplifier 162 and a data write driver 164, which are typical of any state of the art SRAM sense amplifier and data write driver, connected to the complementary data line pair 154-0, 156-0, 154-1, 156-1, 154-(k-1), 156-(k-1). The sense amplifier 162 provides a complementary pair of data outputs DO-0, DON-0, DO-1, DON-1, DO-(k-1), DON-(k-1). An exclusive OR (XOR) gate 166 compares the data out (DO in this example) from sense amplifier 162 with the corresponding data in (DI) to data write driver 164 to provide a write enable signal 168 to NAND gate 170. NAND gate 170 combines a write signal 172 with write enable signal 168 and provides an enable signal to data write driver 164. A sense amp set signal 174 sets the sense amplifier during an access. Preferably, the sense amplifier latches with the set signal 174 or, includes a latch (not shown) that sets with the set signal.

Data is read from the array 160 normally, e.g., as described above if the array is a preferred embodiment kbit wide n by m SRAM array 130 of FIG. 2. During a write, however, in each low power read/write-select 152-0, 152-1, . . . , 152-(k-1), XOR 166 compares the data out (DO) from sense amplifier 162 with data in (DI). If they do not match, i.e., data will be changed in the selected cell, XOR 166 provides a "1" to NAND gate 170, allowing the write to proceed. Otherwise, if DI and DO match, there is no need to write to the selected cell and XOR 166 provides a "0" to NAND gate 170, blocking the write. Optionally, a latch (not shown) may be provided at the XOR 166 to latch the compare results during the write. With the write blocked, no power consumed in writing to the cell. Accordingly, the preferred embodiment low power read/write-select 152-0, 152-1, . . . , 152-(k-1) saves a significant amount of power during write cycles, ~50%.

Figure 4:
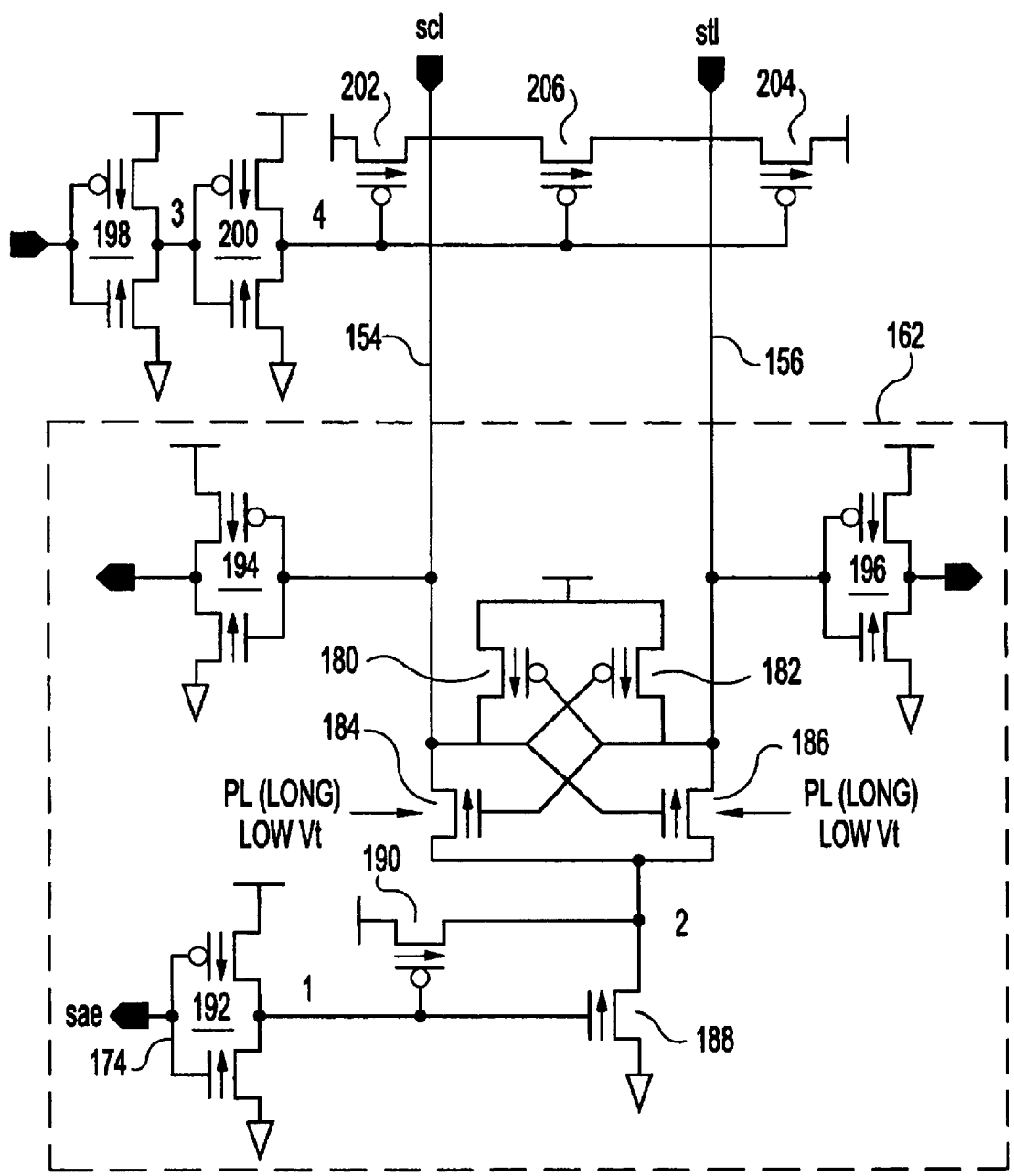
FIG. 4 shows an example of a preferred embodiment PD SOI CMOS sense amplifier, such as may be used in the SRAM example of FIG. 3.

FIG. 4 shows an example of a preferred embodiment PD SOI CMOS sense amplifier 162, such as may be used in the SRAM example of FIG. 3. Complementary data pair 154, 156 are connected to the drains of cross coupled PFETs 180, 182 and cross coupled NFETs 184, 186. Unlike most other devices on the same PD SOI CMOS chip and including the balance of the devices in the sense amplifier 162, both cross coupled NFETs 184 and 186 are fully depleted (FD) NFETs as described hereinbelow. In particular, the FD NFETs 184, 186 do not require body contacts because their bodies are fully depleted. The source of each of cross coupled PFETs 180, 182 is connected to a supply voltage ($V_{dd}$) and cross coupled FD NFETs 184, 186 share a common source connection to the drain of select NFET 188. A sense disable/restore PFET 190, which forms an inverter with select NFET 188, is connected drain to source between the FD NFET 184, 186 common source connection and the supply voltage ($V_{dd}$). An inverter 192 receives the sense amplifier set or enable signal 174 (low active in this example) and drives the gates of select NFET 184 and sense disable/restore PFET 190. Buffer inverters 194, 196 invert complementary data line pair 154, 156 to provide complementary data output pair (DO, DON), which are normally provided to a subsequent driver (not shown) and passed off macro or off chip. Also, shown is a data line restore circuit that includes a pair of series connected inverters 198, 200 driving the gates of data line restore PFETs 202, 204 and equalization PFET 206.

In standby, the sense amplifier 162 is restored to a pre-sense state (as is the array) with complementary data line pair 154, 156 high (preferably both are restored to an identical standby voltage supply, i.e., $V_{dd}$). So, the data line restore input to inverter 196 is low driving the gates of PFETs 202, 204, 206 low and so, turning on PFETs 202, 204, 206. PFETs 202, 204 connect each of the complementary data line pair 154, 156 to the standby voltage supply and PFET 206 connects the pair 154, 156 together to reduce/eliminate any difference. Sense amplifier select signal 174 is high and so, select NFET 188 is off and sense disable PFET 190 is on, pulling the common source connection high such that cross coupled FD NFETs 184, 186 are off. Both outputs of complementary data output pair (DO, DON) are low.

A read begins with driving the input to inverter 196 high, which turns off PFETs 202, 204, 206. A word line is selected and driven high so that a voltage difference develops on each of the bit line pairs. The bit decoder selects one bit line pair and, the differential signal on that pair is coupled to the complementary data pair 154, 156. After sufficient signal is available on the complementary data pair 154, 156, the sense amplifier select signal 174 is asserted (low) to set the sense amplifier. With the sense amplifier select signal 174 low, select NFET 188 is turned on pulling the common source of cross coupled FD NFETs 184, 186 low, setting the sense amplifier as determined by the voltage difference on the complementary data line pair 154, 156. One of complementary data output pair (DO, DON) is driven high by a respective inverter 194, 196.

As with any SRAM, great care is taken by design to maintain data path symmetry for the complementary data pair 154, 156, i.e., to minimize the magnitude of the voltage difference (and so, access time) on the data line pair 154, 156 that is required for sensing. This includes studying the physical design (including the device placement and shape or layout) for potential inequalities and, eliminating any identified inequalities. So, normally the cross coupled FETs (both PFETs 180, 182 and NFETs 184, 186 in this example) would have local body or substrate contacts for a local bias connection. Typically, a substrate bias voltage is necessary to minimize device mismatches or local device thresholds variation. Unfortunately, these body contacts consume power as local substrate leakage, increasing chip leakage power.

However, as noted hereinabove, NFETs 184, 186 are fully depleted in a preferred embodiment sense amplifier. The length of each FD NFET is greater than minimum, preferably by 30–60% and, the threshold voltage ($V_{TFD}$) is lower than other devices, e.g., NFET 188 and those in inverters 192, 194, 196, 198 and 200. The threshold voltage can be reduced with a separate threshold tailoring implant, thinner gate oxide or any other suitable method. Thus lengthening the channels and reducing the $V_T$ widens and fully depletes the bodies of the FD NFETs 184, 186, such that body contacts are unnecessary. So, FD NFETs are used without body contacts in the sense amplifier 162 where needed (i.e., in cross coupled NFETs 184, 186) with partially depleted NFETs and PFETs used elsewhere.

The sense amplifier 162, which converts a small differential signal to a full voltage (rail to rail) difference is an analog circuit. Thus, it should be noted that this embodiment of the present invention has application to other analog circuits such as in a Phase Locked Loop (PLL) circuit, i.e., selectively replacing FETs with FD FETs to eliminate body contacts where body contacts normally would be used in abundance. Further, since typical SRAM cells have a pair of cross coupled NFETs (e.g., 102N, 104N in the SRAM cell 100 of FIG. 100), SRAM cell leakage may be reduced by replacing cross coupled cell NFETs with cross coupled FD NFETs. A cell NFET body contact may be eliminated by replacing all cell NFETs with FD NFETs providing potential cell area savings as well. In addition by using FD NFETs in the 6T cell of FIG. 1 for the SRAM array of FIG. 2, a significant leakage reduction may be realized.

Advantageously, the present invention provides dramatically reduced SRAM leakage current and, correspondingly, standby power reduction. Further, write cycle power consumption may be reduced 50% for additional power savings.

Having thus described preferred embodiments of the present invention, various modifications and changes will occur to a person skilled in the art without departing from the spirit and scope of the invention. It is intended that all such variations and modifications fall within the scope of the appended claims. Examples and drawings are, accordingly, to be regarded as illustrative rather than restrictive.

What is claimed is:

1. A storage array comprising:
   an array of storage latches arranged in rows and columns;
   a power supply select at each row selectively increasing latch supply voltage to said each row; and
   a row selector selecting a row of storage latches, said latch supply voltage to said selected row being increased to a supply voltage and storage latches in remaining rows being provided a reduced supply voltage, ones of said selected row of storage latches being accessed.

2. A storage array as in claim 1 wherein each of said storage latches is a 6 transistor latch.

3. A storage array as in claim 2, wherein said storage array is a static random access memory (SRAM) and said storage latches are SRAM cells, said SRAM further comprising:
   a bit decoder selecting columns, SRAM cells in selected columns being said ones being accessed.

4. A storage array as in claim 3 wherein each said power supply select comprises:
   A first transistor of a first conduction type connected between said supply voltage ($V_{dd}$) and a cell power line, said cell power line connected to each cell in said each row; and
   a second transistor of a second conduction type connected between said supply voltage and said cell power line, selection of said each row turning said first transistor on and passing said supply voltage to said cell power line.

5. A storage array as in claim 4, wherein said first transistor is a p-type field effect transistor (PFET) and said second transistor is a n-type field effect transistor (NFET) having a threshold voltage ($V_T$), said reduced supply voltage being $V_{dd}-V_T$.

6. A storage array as in claim 5, wherein selection of said each row turns said NFET off.

7. A storage array as in claim 6, wherein said each power supply select further comprises:
   an inverter receiving a corresponding word select from said row decoder and driving the gate of each of said PFET and NFET.

8. A storage array as in claim 3, wherein said cells are CMOS SRAM cells in partially depleted (PD) silicon on insulator (SOI).

9. A storage array as in claim 8, wherein leakage is substantially lower in said remaining rows than in said selected row.

10. A storage array as in claim 8, further comprising:
    a sense amplifier in each bit path receiving a signal from a selected said column, said sense amplifier including a pair of cross coupled fully depleted (FD) NFETs sensing data on said signal.

11. A storage array as in claim 10, said sense amplifier further comprising:
    a pair of cross coupled PFETs connected between said cross coupled FD NFETs and a supply voltage;
    a pair of inverters buffering a sense signal on said cross coupled FD NFETs; and
    a sense select/restore inverter, said cross coupled FD NFETs connected to an output of said sense select/restore inverter.

12. A storage array as in claim 11, wherein said storage array is formed in a technology having a minimum device length and said cross coupled FD NFETs are 30–60% longer than said minimum FET length.

13. A storage array as in claim 12, wherein said cross coupled FD NFETs have a lower threshold voltage than partially depleted SRAM NFETs.

14. A storage array as in claim 12, wherein SRAM cell NFETs are FD NFETs.

15. A storage array as in claim 3, further comprising:
    a read/write-select in each bit path selectively blocking cell writes unless cell contents are being changed for a corresponding bit.

16. A storage array as in claim 15, wherein each read/write-select comprises a compare circuit comparing current cell contents with an input data bit, said compare enabling a write only when said compare circuit indicates no match.

17. A storage array as in claim 16, further comprising:
a sense amplifier in said each bit path receiving a signal from a selected said column, said sense amplifier including a pair of cross coupled fully depleted (FD) NFETs sensing data on said signal.

18. A storage array as in claim 17, said sense amplifier further comprising:
a pair of cross coupled PFETs connected between said cross coupled FD NFETs and a supply voltage;
a pair of inverters buffering a sense signal on said cross coupled FD NFETs; and
a sense select/restore inverter, said cross coupled FD NFETs connected to an output of said sense select/restore inverter.

19. A storage array as in claim 1, further comprising:
a cell power line at each said row providing said latch supply voltage; and
a power supply return at said each row providing a constant voltage.

20. A static random access memory (SRAM) comprising:
an array of SRAM cells, arranged in rows and columns;
a word line decoder selecting a row of cells, ones of said selected row of cells being accessed bits;
a bit decoder selecting columns, cells in selected columns being said accessed bits;
a sense amplifier in each bit path receiving a differential signal from a corresponding one of said accessed bits and providing a data output responsive to said differential signal; and
a read/write-select in said each bit path selectively blocking cell writes unless cell contents are being changed for a corresponding bit.

21. A SRAM as in claim 20, wherein each read/write-select comprises a compare circuit comparing current cell contents from said sense amplifier with an input data bit for said corresponding bit, said compare enabling a cell write only when said compare circuit indicates a match.

22. A SRAM as in claim 20, wherein said cells are CMOS SRAM cells in partially depleted (PD) silicon on insulator (SOI), said SRAM further comprising:
a power supply select at each row, selectively increasing cell supply voltage to each said selected row, cells in said each selected row being provided a supply voltage and cells in remaining rows being provided a reduced supply voltage, wherein leakage is substantially lower in said remaining rows than in said selected row.

23. A SRAM as in claim 22, wherein each said power supply select comprises:
a p-type field effect transistor (PFET) connected between a supply voltage ($V_{dd}$) and a cell power line, said cell power line connected to each cell in said each row; and
a n-type field effect transistor (NFET) connected between said supply voltage and said cell power line, selection of said each row turning said PFET on, said PFET and passing said supply voltage to said power line.

24. A SRAM as in claim 23, wherein said NFET has a threshold voltage ($V_T$) and said reduced supply voltage is $V_{dd}-V_T$.

25. A SRAM as in claim 24, wherein each said power supply select further comprises:
an inverter receiving a word select from said word line decoder and driving the gate of each of said PFET and NFET.

26. A SRAM as in claim 20, wherein said cells are CMOS SRAM cells in partially depleted (PD) silicon on insulator (SOI), said sense amplifier comprising:
a pair of cross coupled fully depleted (FD) NFETs sensing data on said differential signal.

27. A SRAM as in claim 26, said sense amplifier further comprising:
a pair of cross coupled PFETs connected between said cross coupled FD NFETs and a supply voltage;
a pair of inverters buffering a sense signal on said cross coupled FD NFETs; and
a sense select/restore inverter, said cross coupled FD NFETs connected to an output of said sense select/restore inverter.

28. A SRAM as in claim 27, wherein said SRAM is formed in a technology having a minimum device length and said cross coupled FD NFETs are 30–60% longer than said minimum FET length.

29. A SRAM as in claim 28, wherein said cross coupled FD NFETs have a lower threshold voltage than partially depleted SRAM NFETs.

30. A SRAM as in claim 23, further comprising:
a cell power line at each said row providing said cell supply voltage; and
a power supply return at said each row providing a constant voltage.

31. A SRAM as in claim 27, wherein SRAM cell NFETs are FD NFETs.

32. A CMOS static random access memory (SRAM) comprising:
an array of SRAM cells arranged in rows and columns;
a power supply select at each row selectively increasing cell supply voltage to said each row;
a word line decoder selecting a row of cells, said selected row of cells being increased to a supply voltage and cells in remaining rows being provided a reduced supply voltage, ones of said selected row of cells being accessed;
a bit decoder selecting columns, cells in selected columns being said accessed bits;
a sense amplifier in each bit path receiving a differential signal from a corresponding one of said accessed bits and providing a data output responsive to said differential signal; and
a read/write-select in said each bit path selectively blocking cell writes unless cell contents are being changed for a corresponding bit, wherein leakage is substantially lower in said remaining rows than in said selected row.

33. A CMOS SRAM as in claim 32, wherein each said power supply select comprises:
A first field effect transistor (FET) of a first conduction type connected between said supply voltage ($V_{dd}$) and a cell power line, said cell power line connected to each cell in said each row; and
A second FET of a second conduction type connected between said supply voltage and said cell power line, selection of said each row turning said first transistor on and passing said supply voltage to said power line.

34. A CMOS SRAM as in claim 33, wherein said first FET is p-type and said second FET is a n-type, said NFET having a threshold voltage ($V_T$), said reduced supply voltage being $V_{dd}-V_T$.

35. A CMOS SRAM as in claim 34, wherein said each power line supply select further comprises:

an inverter receiving a word select from said word line decoder and driving the gate of each of said PFET and NFET.

36. A CMOS SRAM as in claim 32, wherein each read/write-select comprises a compare circuit comparing current cell contents with an input data bit, said compare enabling a write only when said compare circuit indicates a match.

37. A CMOS SRAM as in claim 32, wherein said cells are in partially depleted (PD) silicon on insulator (SOI).

38. A CMOS SRAM as in claim 37, said sense amplifier comprising a pair of cross coupled fully depleted (FD) NFETs sensing data on said differential signal.

39. A CMOS SRAM as in claim 38, said sense amplifier further comprising:
 a pair of cross coupled PFETs connected between said cross coupled FD NFETs and a supply voltage;
 a pair of inverters buffering a sense signal on said cross coupled FD NFETs; and
 a sense select/restore inverter, said cross coupled FD NFETs connected to an output of said sense select/restore inverter.

40. A CMOS SRAM as in claim 39, wherein said cross coupled FD NFETs are 30–60% longer than a defined minimum FET length.

41. A CMOS SRAM as in claim 40, wherein said cross coupled FD NFETs have a lower threshold voltage than partially depleted SRAM NFETs.

42. A CMOS SRAM as in claim 39, wherein SRAM cell NFETs are FD NFETs.

43. A CMOS SRAM as in claim 32, further comprising:
 a cell power line at each said row providing said cell supply voltage; and
 a power supply return at said each row providing a constant voltage.

44. A partially depleted (PD) silicon on insulator (SOI) CMOS circuit formed in a technology having a minimum device length and including one or more fully depleted (FD) NFETs, each of said FD NFETs having a lower threshold voltage than partially depleted NFETs and being 30–60% longer than said minimum FET length, whereby a body contact is unnecessary at said FD NFETs to reduce sub-threshold leakage.

45. A PD SOI CMOS circuit as in claim 44, wherein said PD SOI CMOS circuit is a sense amplifier comprising a pair of cross coupled FD NFETs sensing data on a differential signal.

46. A sense amplifier as in claim 45, further comprising:
 a pair of cross coupled PFETs connected between said cross coupled FD NFETs and a supply voltage;
 a pair of inverters buffering a sense signal on said cross coupled FD NFETs; and
 a sense select/restore inverter, said cross coupled FD NFETs connected to an output of said sense select/restore inverter.

47. A storage array comprising:
 an array of storage latches arranged in rows and columns;
 a power supply select at each row selectively increasing latch supply voltage to said each row;
 a row selector selecting a row of storage latches, said latch supply voltage to said selected row being increased to a supply voltage and storage latches in remaining rows being provided a reduced supply voltage, ones of said selected row of storage latches being accessed;
 a column decoder selecting said ones being accessed; and
 a read/write-select including an exclusive or (XOR) comparing current latch contents with an input data bit, said XOR enabling switching latch contents responsive to said XOR indicating no match.

48. A storage array as in claim 47, wherein an output of said XOR indicates said match and selectively passes a write signal to a data write circuit.

49. A static random access memory (SRAM) comprising:
 an array of SRAM cells, arranged in rows and columns;
 a word line decoder selecting a row of cells, ones of said selected row of cells being accessed bits;
 a bit decoder selecting columns, cells in selected columns being said accessed bits;
 a sense amplifier in each bit path receiving a differential signal from a corresponding one of said accessed bits and providing a data output responsive to said differential signal; and
 a read/write-select in said each bit path including an exclusive or (EXOR) comparing current cell contents from said sense amplifier with an input data bit for said corresponding bit, said XOR enabling a cell write only when said XOR indicates a match and selectively blocking cell writes whenever cell contents are not being changed for a corresponding bit.

50. A SRAM as in claim 49, wherein an output of said XOR indicates said match and selectively passes a write signal to a data write circuit.

51. A CMOS static random access memory (SRAM) comprising:
 an array of SRAM cells arranged in rows and columns;
 a power supply select at each row selectively increasing cell supply voltage to said each row;
 a word line decoder selecting a row of cells, said selected row of cells being increased to a supply voltage and cells in remaining rows being provided a reduced supply voltage, ones of said selected row of cells being accessed;
 a bit decoder selecting columns, cells in selected columns being said accessed bits;
 a sense amplifier in each bit path receiving a differential signal from a corresponding one of said accessed bits and providing a data output responsive to said differential signal; and
 a read/write-select in said each bit path and including an exclusive or (XOR) comparing current cell contents with an input data bit, an output of said EXOR indicating whether said current cell contents and said input bit match, said XOR passing a write signal to a data write circuit whenever said XOR indicates no match and otherwise blocking said write signal, wherein leakage is substantially lower in said remaining rows than in said selected row.

\* \* \* \* \*